Nov. 17, 1959 D. A. JENNY 2,913,642

METHOD AND APPARATUS FOR MAKING SEMI-CONDUCTOR DEVICES

Filed May 28, 1953

INVENTOR.
Dietrich A. Jenny

BY J. L. Whittaker
ATTORNEY

United States Patent Office 2,913,642

Patented Nov. 17, 1959

2,913,642

METHOD AND APPARATUS FOR MAKING SEMI-CONDUCTOR DEVICES

Dietrich A. Jenny, Princeton, N.J., assignor to Radio Corporation of America, a corporation of Delaware Application May 28, 1953, Serial No. 358,000

14 Claims. (Cl. 317—235)

This invention relates to semi-conductor devices and more particularly to an improved method and novel apparatus for making such devices of the type known as alloy junction transistors.

It is well known to make a transistor by alloying relatively small bodies of an impurity-yielding material into opposite sides of a wafer of a semi-conductive material such as germanium or silicon to form within the wafer two closely spaced, oppositely disposed P-N rectifying junctions. In previous methods of carrying out this process, a relatively small pellet of a selected impurity-yielding material has been placed upon one side of a semi-conductive wafer. The pellet is heated in contact with the wafer to cause it to wet and to adhere to the surface of the wafer. Subsequently a second pellet is placed on the opposite side of the wafer from the first pellet and the entire assembly is heated a second time to melt both the pellets to cause them to alloy with and to diffuse into the wafer, thereby to form P-N rectifying junctions.

Some difficulties have been experienced in producing transistors according to this method, particularly in aligning the two pellets so that P-N rectifying junctions may be formed in accurate co-axial alignment. Further, not only are two heating operations required by this method to produce a device having two spaced P-N rectifying junctions, but also a further application of heat is required to attach electrical leads to the elements of the device.

Accordingly, it is an object of the present invention to provide a novel and improved method of making semiconductor devices.

Another object is to provide a novel and improved method for making alloy junction-type transistors.

Another object is to provide a novel and improved method of making an alloy junction-type transistor having two P-N rectifying junctions disposed in accurate co-axial alignment.

Another object is to provide novel and improved apparatus for making an alloy junction-type transistor having electrical leads attached to the elements thereof.

Another object is to provide a novel and improved method and apparatus for simultaneously forming an alloy junction-type transistor and attaching electrical leads to the elements thereof.

These and other objects may be accomplished according to the instant invention which comprises a novel and improved method and apparatus for forming a semiconductor device of the alloy junction type. Broadly, the invention provides means for holding a semi-conductor body, means for exposing a selected area upon the surface of the body, masking a portion of the selected area leaving a selected portion thereof exposed, and alloying an impurity-yielding material to the body upon the selected portion of the exposed surface.

The invention may be more easily understood by reference to the following detailed description and to the drawing of which:

Similar reference characters have been applied to similar elements throughout the drawings.

Figure 1:
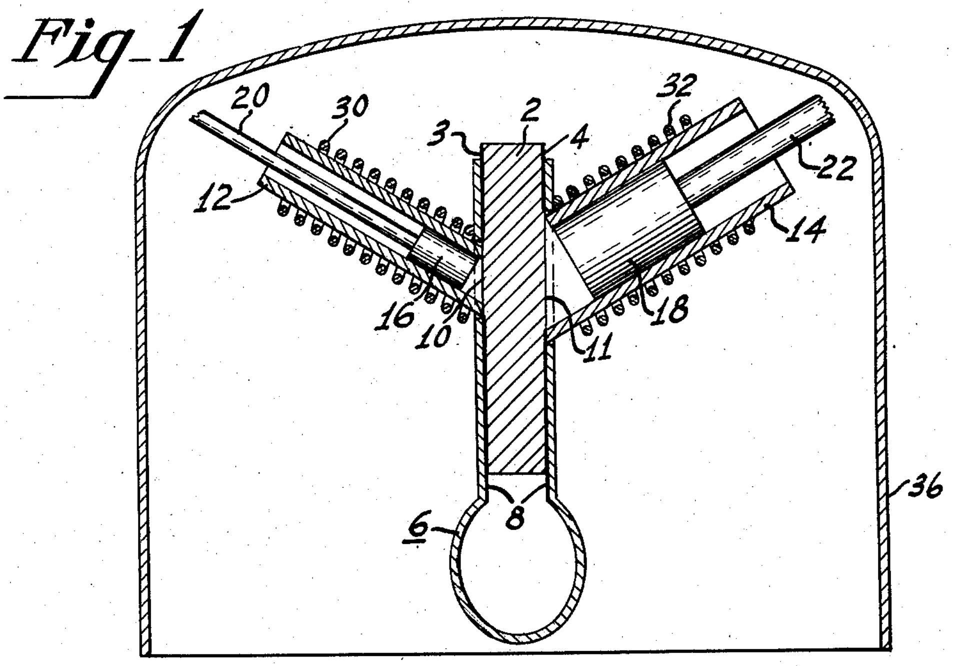
Figure 1 is a schematized, elevational, cross-sectional view of a semi-conductor device and apparatus according to the instant invention.
Figure 2:
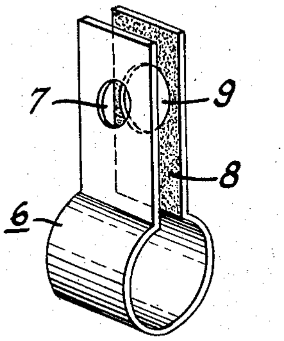
Figure 2 is an enlarged perspective view of a spring clip also shown in section in Figure 1.
Figure 3:
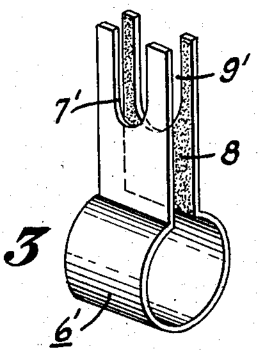
Figure 3 is an enlarged perspective view of a spring clip according to another embodiment of the invention.

An alloy junction-type transistor may be produced by utilizing a preferred embodiment of apparatus constructed in accordance with the present invention as illustrated in the drawing. Figure 1 shows a wafer 2 of N-type semi-conductive germanium about ¼″ square and .005″ thick clamped in a spring clip 6. The clip, shown in fuller detail in Figure 2, may be of any metal such as nickel or steel that does not soften at elevated temperatures such as 500° C. to 900° C., and is provided with a tinned surface 8 disposed in contact with the wafer. The clip is U-shaped, about ½″ long, and has holes 7 and 9 in each of its legs. These holes may be about .030″ and .070″ in diameter, respectively, for example, and are located directly opposite each other in accurate co-axial alignment. Alternatively the clip may be provided with notches 7′ and 9′ such as those shown in Figure 3. The clip masks the opposite surfaces 3 and 4 of the wafer leaving exposed upon these surfaces accurately aligned areas 10 and 11.

The wafer, clamped in the clip, is placed between the ends of a pair of carbon tubes 12 and 14 adapted to fit within the holes 7 and 9 respectively. The tubes are disposed at an angle from the horizontal, with their lower ends abutting the wafer. They are provided with heating means such as the electrical resistance coils 30 and 32 connected to any convenient source of electric power (not shown). Pellets of indium 16 and 18 about .01″ and .05″ in diameter, respectively, are dropped into the tubes and allowed to fall through them to contact the germanium wafer. Electrical lead wires 20 and 22 which may be of platinum are inserted in the tubes to contact and to rest upon the indium pellets.

The entire assembly is immersed in a non-oxidizing atmosphere such as hydrogen or argon to minimize undesirable oxidation of the materials of the device. Such an atmosphere may be confined by any convenient means such as the bell jar 36, or it may be a flowing stream of a gas such as may be produced by a nozzle (not shown).

The tubes are heated at about 500° C. for about five minutes to melt the indium pellets and to cause them to alloy with and to diffuse into the germanium wafer to form P-N rectifying junctions therein. Simultaneously the indium wets and fuses to the electrical lead wires 20 and 22. Sufficient heat is transmitted to the wafer and to the clip to melt the solder and to form a non-rectifying solder connection between the wafer and the spring clip.

Figure 4:
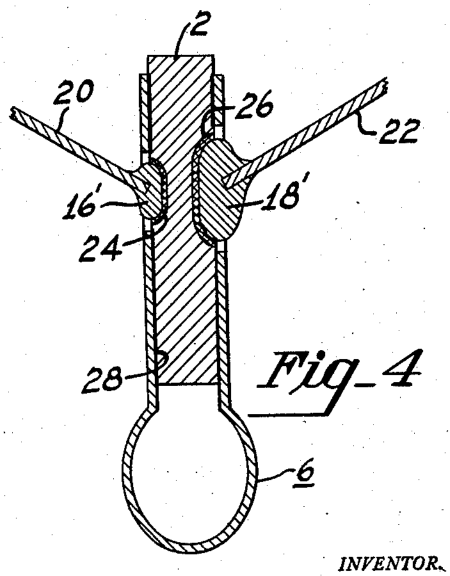
Figure 4 is a schematized, elevational, cross-sectional view of a semi-conductor device according to the invention.

When the device has cooled sufficiently to freeze the indium and the solder, the tubes are drawn slightly apart and the device is removed from between them. The device may then be conventionally etched, mounted and potted. The device so formed is illustrated in Figure 4 and comprises the spring clip 6 joined to the germanium wafer 2 by a non-rectifying solder connection 28. The clip may serve as a base connection when the device is employed in a circuit. The pellets of indium 16 and 18 (Figure 1) are fused to the wafer to form the electrodes 16′ and 18′, and to form the P-N rectifying junctions 24 and 26 within the wafer, each adjacent one of the electrodes. The indium is also fused to the electrical lead wires 20 and 22 which may serve as electrode connections.

It should be understood that the practice of the invention is not limited to the materials nor to the exact device described herein, but is generally advantageous in the production of any semi-conductor device having two oppositely disposed P-N rectifying junctions within a body of semi-conductive material. Such devices may, for example, comprise a silicon body having thallium or antimony bodies fused to it.

An essential feature of the invention is the spring clip having an aperture or notch which serves principally as locating means for the carbon tube. Thus, when the holes or notches in the opposite legs of the U-shaped clip are aligned, the tubes will contact a wafer held in the clip upon aligned portions of the wafer's opposite surfaces. The degree of accuracy in aligning the indium pellets is controlled by the degree of accuracy obtainable in aligning the holes in the clip rather than by the degree of accuracy obtainable in aligning the tubes or by aligning the pellets by other means. Holes in such a clip may readily be aligned by known mechanical means such as a die with a relatively high degree of accuracy.

The carbon tubes, which may alternatively be of any other refractory inert material such as silica, should be adapted to fit flatly against the exposed surfaces of the germanium wafer. This is desirable in order to minimize the possibility of molten indium flowing along the surface of the wafer beyond the tube apertures; however, the fit is not critical since the surface tension of the indium aids in restraining it.

The electrical lead wires 20 and 22 need not be of platinum but may be of any conductive material having a melting point above the forming temperature of the device. It is preferred, however, to make these lead wires of one of the noble metals such as platinum, palladium or gold in order to minimize difficulties in the etching step that conventionally follows the forming of the P-N rectifying junctions. If the lead wires are of a base metal such as copper, they may cause undesirable contamination of an acid etching bath into which the device may be immersed.

In order to prevent similar contamination of an acid etching bath by the spring clip, it is preferred to coat the spring clip prior to etching the device with a suitable resist material such as beeswax or lacquer. This may readily be done by spraying the device before it is removed from between the two carbon tubes, or by dipping the device into a wax or a lacquer while protecting the leads and exposed areas from contact with the wax or lacquer by a suitable mask.

The electrical heating elements 30 and 32 are not essential in the practice of the invention. Any convenient means may alternatively be used to heat the pellets and the wafer to a desired forming temperature. For example, the entire apparatus may be placed in a furnace, or a non-oxidizing gas flame may be directed upon the wafer. The electrical heating coils are preferred, however, because they are relatively convenient and are readily controllable.

It should of course be understood that the dimensions of the parts as described heretofore are purely illustrative. The practice of the invention is equally advantageous in the production of semi-conductor devices of any desired size.

There have thus been described a novel method and apparatus for making a semi-conductor device of the alloy junction type. The method and apparatus are particularly suitable for producing an alloy junction transistor having accurately aligned P-N rectifying junctions.

What is claimed is:

1. Apparatus for making a semi-conductor device comprising holding means adapted to hold a semi-conductor body, said means defining an aperture to expose a selected portion of the surface of said body, and passageway means having walls adapted to mask a part of said selected portion of said surface and to expose a selected part thereof, said passageway means also being adapted to hold a quantity of an impurity material against said body.

2. Apparatus according to claim 1 in which said holding means comprises means having a tinned surface and is adapted to form a part of said device.

3. Apparatus according to claim 1 in which said holding means comprises a metal clip having two legs and having an inner surface of one of said legs tinned, and having an aperture extending through one of said legs from the inner to the outer surface thereof.

4. Apparatus according to claim 3 in which said passageway means comprises a tube of an inert refractory material, said tube having open ends, one of said ends being adapted to fit within said aperture of said leg.

5. Apparatus for making a semi-conductor device comprising masking means to mask a portion of the surface of a semi-conductor body and to leave selected portions of said surface unmasked, said masking means comprising an open-ended inert refractory tube and locating means cooperative with said masking means accurately to locate said selected unmasked portions with respect to each other, said locating means comprising a spring clip having two legs, each of said legs defining an aperture.

6. Apparatus according to claim 5 in which said locating means comprises a U-shaped clip having a hole in each leg thereof, and said masking means comprises a pair of tubes, each one of said tubes having an open end adapted to be inserted through one of said holes to contact a semi-conductor body when said body is held in said clip.

7. In a method of making a semi-conductor device comprising alloying an impurity-yielding material to a semi-conductor body to form a P-N rectifying junction within said body, the steps of placing said body in a clip and alloying said impurity-yielding material to said body through an aperture in said clip.

8. The method according to claim 7 including the steps of providing said clip with a tinned surface and placing said surface in contact with said body, thereby to form a non-rectifying junction between said clip and said body when said body is heated.

9. A semiconductor device comprising a spring clip having two legs, and a body of semiconductive material disposed between said legs and connected to one of said legs by a non-rectifying solder connection, in which one of said legs defines an aperture, an electrode body being disposed within said aperture and fused to said semi-conductive body, and in which there is a P-N rectifying junction within said semi-conductive body adjacent said electrode body.

10. A device according to claim 9 comprising an electrical lead wire fused to said electrode body.

11. A semi-conductor device comprising a spring clip having two juxtaposed legs, each of said legs defining an aperture, said apertures being disposed in co-axial alignment with each other, a semi-conductor body disposed between said legs and fused to one of said legs by a non-rectifying connection, a body of impurity-yielding material disposed within said aperture and fused to said semi-conductor body, an electrical lead wire fused to said impurity-yielding material body, and a P-N rectifying junction disposed within said semi-conductor body adjacent said impurity-yielding material body.

12. A method of making a semiconductor device comprising soldering a face of a semiconductor wafer of one conductivity type to a surface of a metal electrode having an aperture therein, masking a portion of said wafer face within said aperture so as to leave an exposed surface area, positioning a quantity of a substance capable of converting said semiconductor to opposite conductivity type upon said wafer face within said aperture, said substance being confined within said exposed surface area within said aperture, and heating the assembly to cause said substance to form a P-N junction within said wafer.

13. A method of making a semiconductor device comprising affixing a face of a semiconductor wafer to a surface of an electrode having an aperture therein, masking a portion of said wafer face exposed within said aperture, introducing within said aperture in contact with said wafer a quantity of a substance capable of forming a rectifying barrier within said semiconductor, said substance being confined within the unmasked portion within said aperture, and heating the assembly to form said barrier.

14. A method of making a transistor comprising soldering a face of a semiconductor wafer to a surface of a base electrode having an aperture therein, masking a portion of said wafer face exposed within said aperture, introducing within said aperture in contact with said wafer a small quantity of a substance capable of forming a rectifying barrier within said semiconductor, said substance being confined within the unmasked portion within said aperture, positioning another quantity of a barrier-forming substance on the face of said wafer opposite said first mentioned face, and heating the assembly to form said barrier.

References Cited in the file of this patent

UNITED STATES PATENTS

| | | |
|---|---|---|
| 799,542 | Davis | Sept. 12, 1905 |
| 1,551,764 | Muller | Sept. 1, 1925 |
| 1,827,872 | Frost | Oct. 20, 1931 |
| 1,949,383 | Weber | Feb. 27, 1934 |
| 2,309,081 | Priessman et al. | Jan. 26, 1943 |
| 2,754,455 | Pankove | July 10, 1956 |
| 2,777,101 | Cohen | Jan. 8, 1957 |
| 2,777,974 | Brattain et al. | Jan. 15, 1957 |
| 2,778,980 | Hall | Jan. 22, 1957 |

FOREIGN PATENTS

| | | |
|---|---|---|
| 262,107 | Switzerland | Sept. 1, 1949 |
| 646,063 | Great Britain | Nov. 15, 1950 |